United States Patent
Walker

(10) Patent No.: US 6,445,585 B1
(45) Date of Patent: Sep. 3, 2002

(54) DOOR-IN-A-DOOR DEVICE ACCESS MODULE

(75) Inventor: Steven Dale Walker, Arden, NC (US)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 09/626,573

(22) Filed: Jul. 27, 2000

(51) Int. Cl.[7] .................................................. H05K 5/02
(52) U.S. Cl. ........................ 361/724; 361/610; 361/740; 292/145; 292/164
(58) Field of Search ................................. 361/683–686, 361/724–727, 740, 759, 610, 600, 601, 605; 292/175, 145, 163, 164

(56) References Cited

U.S. PATENT DOCUMENTS

| | | | | |
|---|---|---|---|---|
| 2,130,250 A | * | 9/1938 | Reed | 361/610 |
| 3,420,381 A | * | 1/1969 | Bradfield | 361/610 |
| 5,673,174 A | * | 9/1997 | Hamirani | 361/686 |
| 6,028,267 A | * | 2/2000 | Byrne | 361/610 |

* cited by examiner

Primary Examiner—Darren Schuberg
Assistant Examiner—Hung Van Duong
(74) Attorney, Agent, or Firm—Martin J. Moran

(57) ABSTRACT

A door comprising a panel member having a first side and a second side and an opening therebetween; a hinge disposed adjacent to said opening; a control module; said control module hingedly attached to said panel by said hinge; said control module includes an electronic unit which has a first side; said control module being pivotable on said hinge between a first position wherein said electronic unit first side is visible through said opening from said panel first side and a second position where said electronic unit first side is visible from said panel second side.

2 Claims, 4 Drawing Sheets

DOOR-IN-A-DOOR DEVICE ACCESS MODULE

BACKGROUND OF THE INVENTION

1. Field of the Invention

This invention relates to an electronics enclosure door and, more specifically, to an electronics enclosure door for electric power equipment having an opening therethrough and a display module hingedly attached to the door which may be positioned to be seen from outside the electronics enclosure door or from inside the electronics enclosure door.

2. Background Information

An electronics enclosure is an enclosure used to house components such as a Programmable Logic Controller or "PLC," a Dynamic Data Exchange or "DDE" server, or other electronics. The components need to be monitored, tested, and occasionally calibrated. The enclosure typically includes a door which is hingedly attached to the enclosure so that the door may be opened or closed. Monitoring and/or testing equipment is typically located in a control module which is mounted on the enclosure door. The enclosure door includes an opening therethrough that allows the control module to be visible from the outside when the door is closed. The components are connected to the control module via a cable.

While this arrangement is convenient for monitoring the components, testing and/or calibration of the components is more difficult as an operator standing within the enclosure, or on the inner side of the enclosure door, cannot see the control module. Thus, testing and/or calibration of the components requires the operator to adjust the equipment and then exit the enclosure to view the control module.

There is a need, therefore, for a door to an electronics enclosure which allows an operator to view the control module from either side of the door.

There is a further need for a device which may be attached to an electronics enclosure door that would enable the control module to be seen from either side of the door.

SUMMARY OF THE INVENTION

These needs, and others, are met by the invention which provides for a frame which is hingedly attached to an electronics enclosure door. The frame is structured to support a control module adjacent to an opening through the electronics enclosure door. In a first position of the frame, the control module is visible from a first side, or outside, of the electronics enclosure door through the opening. In a second position, the frame is pivoted about the hinge so that the control module is visible from a second side, or inside, of the electronics enclosure door. The frame may further include a latch to secure the frame in either the first position or the second position.

Normally, the electronics enclosure door is typically in a first, closed position securing the components within the electronics enclosure. When the door is in the first position, the frame is also in a first position supporting the control module so that the control module is visible to an operator standing outside the enclosure through an opening in the electronics enclosure door. When the enclosure door is in a second, or open position, the frame may be pivoted about the hinge into a second position so that the control module is visible to an operator located on the second side, or inside, of the door.

BRIEF DESCRIPTION OF THE DRAWINGS

A fall understanding of the invention can be gained from the following description of the preferred embodiments when read in conjunction with the accompanying drawings in which.

DETAILED DESCRIPTION

Figure 1:
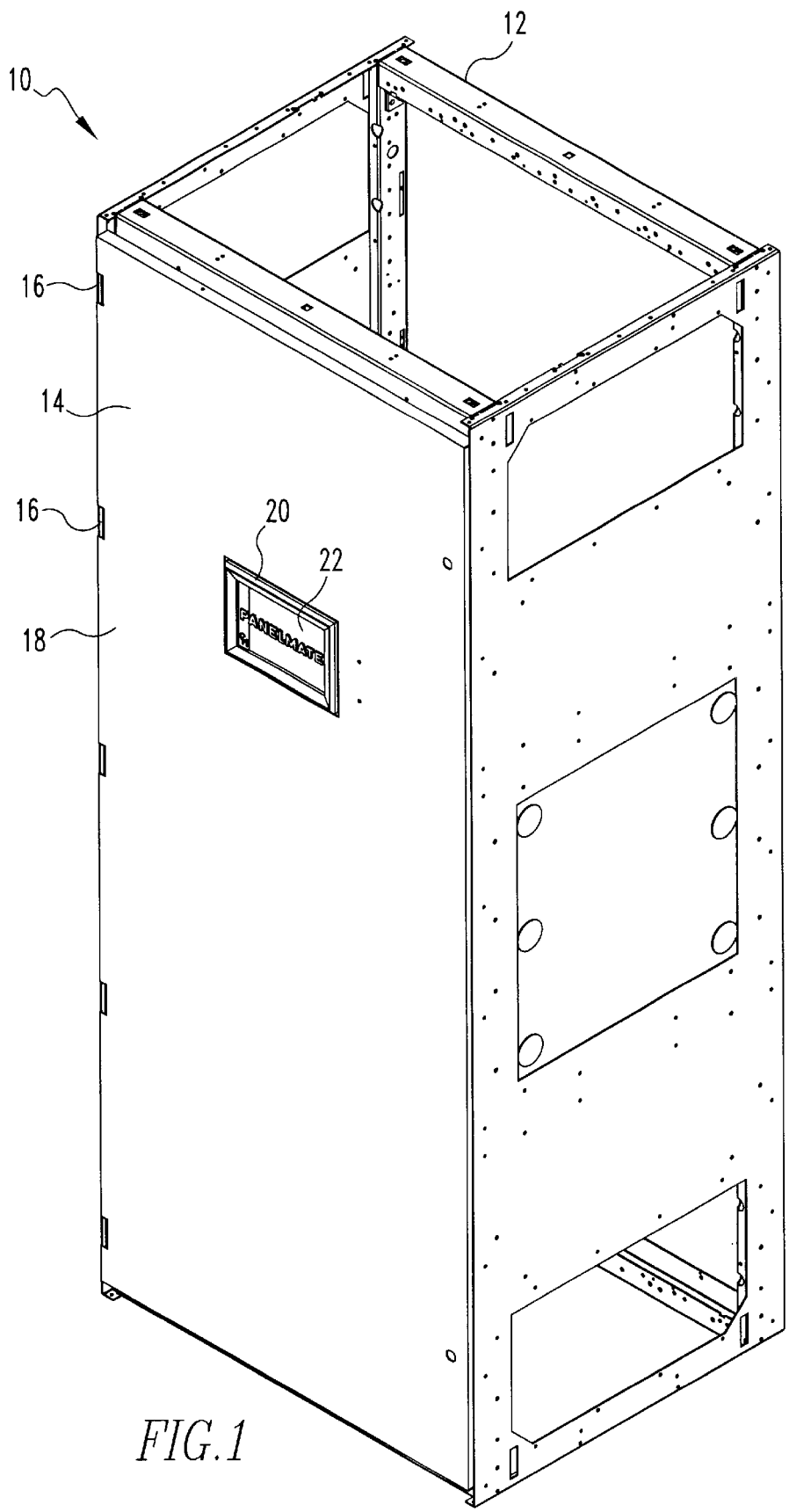
FIG. 1 is an isometric view of the door in the first position and the frame in the first position.
Figure 2:
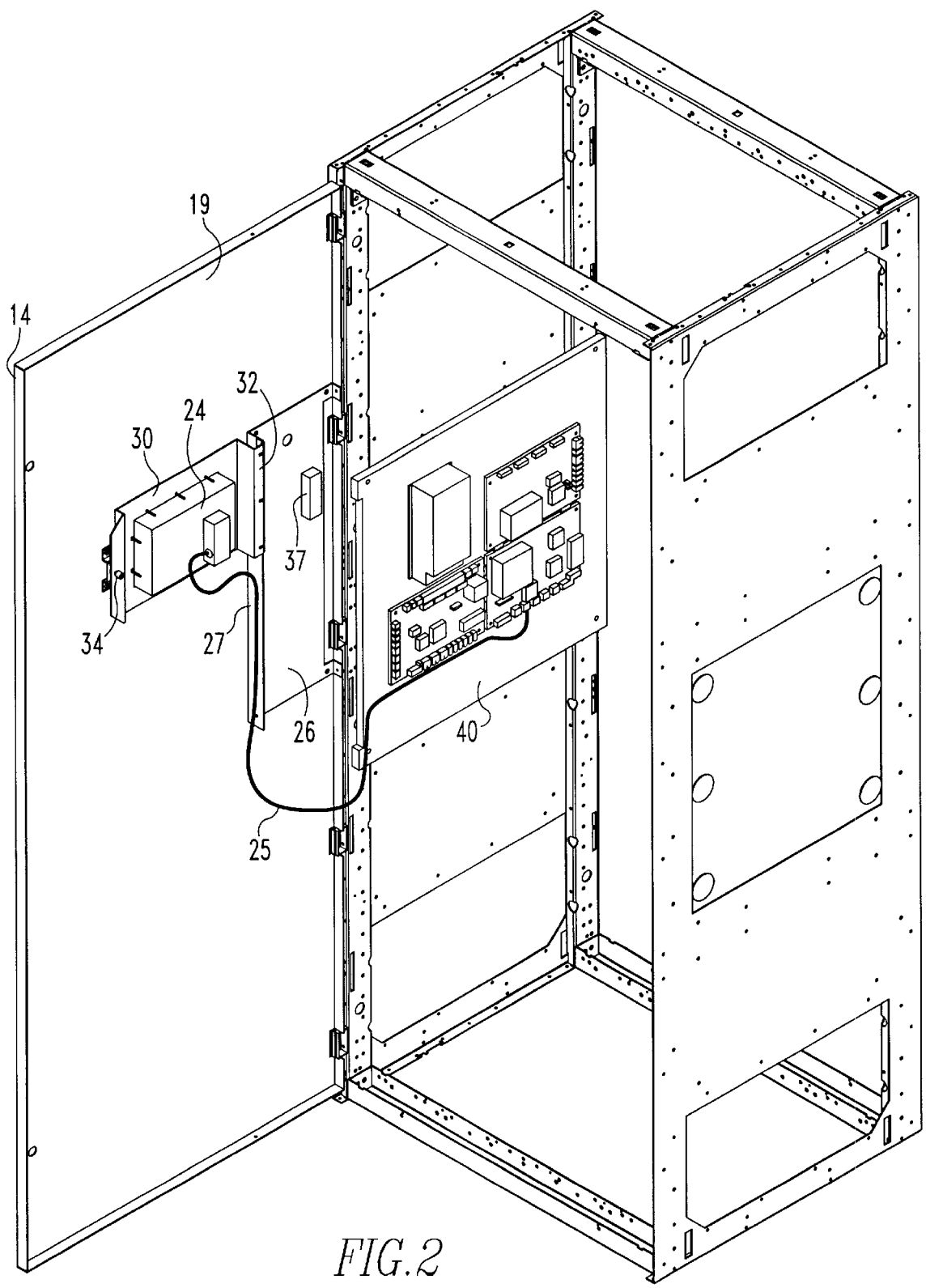
FIG. 2 is an isometric view of the door in the second position and the frame in the first position.
Figure 3:
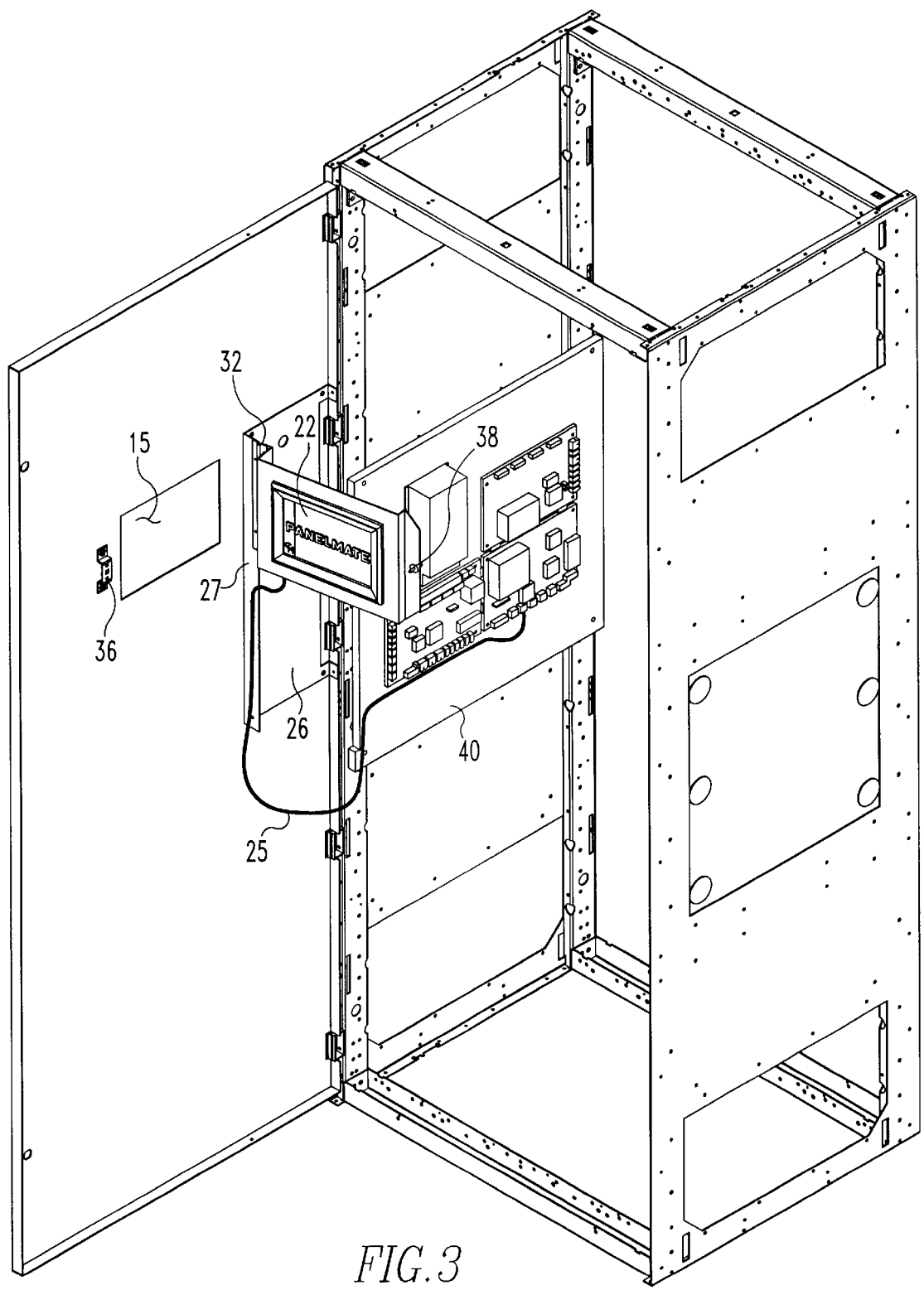
FIG. 3 is an isometric view of the door in the second position and the frame in between the first and second positions.

As shown in FIG. 1, an electronics enclosure 10 includes a housing 12 and a door 11. The door 11 includes a panel member 14 and door hinges 16. The panel member 14 is connected to housing 12 by the door hinges 16. The panel member 14 has a first side 18 and a second side 19 (FIG. 2). The panel member 14 may be pivoted on door hinges 16 between a first, closed position, shown in FIG. 1, and a second, open position, shown in FIG. 2. As shown in FIG. 3, an opening 15 extends between panel first side 18 and panel second side 19. As shown in FIG. 2, enclosure 10, may house a component 40 or multiple components such as a PLC, a DDE server, or other electronics.

Figure 4:
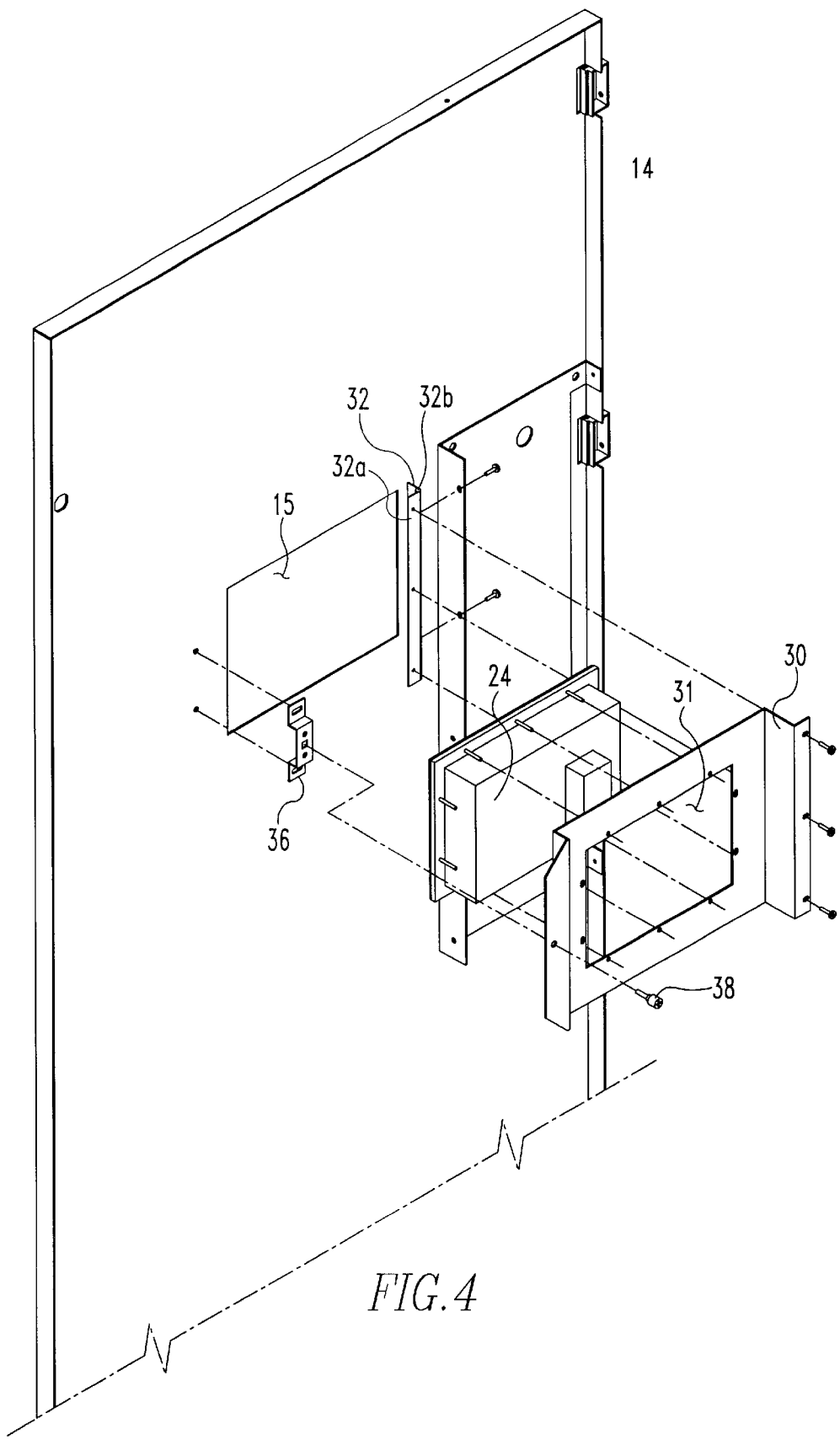
FIG. 4 is an exploded view of the frame adjacent to the door.

A control module 20 includes a frame 30 and an electronic unit 24, such as a Panelmate® video control panel manufactured by Eaton Corporation, 173 Heatherdown Drive, P.O. Box 6166, Westerville, Ohio 43081-6166. The control module has a first side 22 which includes a man/machine interface, such as a video screen or other readout devices (not shown), and/or input devices such as a keypad of buttons, switches, etc. The electronics module 24 is connected by a cable 25 to component 40. The frame 30 includes a hinge 32 and a latch 34. Hinge 32 includes two hinge brackets 32a, 32b which are pivotally connected to each other as shown in FIG. 4. The latch 34 may be any common type latch including, but not limited to, a thumbscrew latch. The thumbscrew latch 34 includes a nut housing 36 and a thumbscrew 38. Frame 30 includes a medial opening 31 sized to fit around electronics unit 24.

As shown on FIG. 2, a mounting bracket 26 may be disposed on panel second side 19. The mounting bracket preferably includes a raised edge 27. Raised edge 27 is of a sufficient size so that when frame 30 is rotated 180 degrees on hinge 32, frame 30 does not contact panel second side 19. A second latch means 37, such as a magnetic latch, may be disposed on bracket 26 to hold the frame 30 in the second position (described below).

When assembled, the second hinge bracket 32b is coupled to raised edge 27. First hinge member 32a is coupled to the frame 30. The frame 30 is coupled by hinge 32 to mounting bracket 26, so that the frame 30 is adjacent to panel opening 15. The frame 30 and the hinge 32 are structured so that the frame 30 may pivot between a first position, shown in FIG. 2, and a second position wherein frame 30 is pivoted about 180 degrees about hinge 32. When frame 30 is in the first position, electronics unit first side 22 is visible, through opening 15, from the panel first side 18. When frame 30 is pivoted on hinge 32 into the second position, the electronic unit first side 22, is visible from the panel second side 19.

Thus, when panel member 14 is in its first, closed position, a user may access electronic unit first side 22 from outside enclosure 10. When panel member 14 is in its second, open position, a user may release latch 34 and pivot the control unit 20 about hinge 32 so that the electronic unit first side 22 is visible to a user standing on panel second side 19. A user may actually enter enclosure 10 and close panel member 14 so that panel member 14 is in the first, closed position. If a user is within the enclosure 10, the user may release latch 34 and rotate control unit 20 about hinge 32 so that the user may access the electronic unit first side 22 while standing within enclosure 10.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. A door comprising:
    a panel member having a first side and a second side and an opening therebetween;
    a hinge disposed adjacent to said opening;
    a control module;
    said control module hingedly attached to said panel by said hinge;
    said control module includes an electronic unit which has a first side;
    said control module being pivotable on said hinge between a first position
   wherein said electronic unit first side is visible through said opening from said panel first side and a second position where said electronic unit first side is visible from said panel second side;
    said panel includes a mounting bracket on said second side;
    said mounting bracket includes a raised edge;
    said hinge coupled to said raised edge; and
    said raised edge having a sufficient size to allow said control module to rotate 180 degrees on said hinge without contacting said panel second side.

2. An electronics enclosure for electrical power equipment comprising:
    a housing;
    a door having a panel member and a door hinge;
    said panel member having a first side and a second side and an opening therebetween;
    a hinge disposed adjacent to said opening;
    a control module;
    said control module hingedly attached to said panel by said hinge;
    said control module includes an electronic unit which has a first side;
    said control module being pivotable on said hinge between a first position
   wherein said electronic unit first side is visible from said panel second side;
    said panel includes a mounting bracket on said second side;
    said mounting bracket includes a raised edge;
    said hinge coupled to said raised edge; and
    said raised edge having a sufficient size to allow said control module to rotate 180 degrees on said hinge without contacting said panel second side.

* * * * *